United States Patent
Yukawa et al.

(10) Patent No.: US 8,118,584 B2
(45) Date of Patent: Feb. 21, 2012

(54) DEVICE AND METHOD FOR PROCESSING CARRIER TAPE

(75) Inventors: Noriaki Yukawa, Amagasaki (JP); Hiroshi Otsuka, Itami (JP)

(73) Assignee: Sumitomo Bakelite Company Limited, Tokyo (JP)

( * ) Notice: Subject to any disclaimer, the term of this patent is extended or adjusted under 35 U.S.C. 154(b) by 687 days.

(21) Appl. No.: 10/519,207

(22) PCT Filed: Jun. 23, 2003

(86) PCT No.: PCT/JP03/07968
§ 371 (c)(1), (2), (4) Date: Sep. 21, 2005

(87) PCT Pub. No.: WO04/000530
PCT Pub. Date: Dec. 31, 2003

(65) Prior Publication Data
US 2006/0093794 A1    May 4, 2006

(30) Foreign Application Priority Data

Jun. 25, 2002  (JP) .................................. 2002-183794
Mar. 14, 2003  (JP) .................................. 2003-069630

(51) Int. Cl.
B29C 59/02  (2006.01)

(52) U.S. Cl. ........ 425/369; 425/145; 425/385; 425/396; 425/397; 425/403.1; 156/209; 156/350; 156/458; 156/361

(58) Field of Classification Search .................. 425/112, 425/122, 125, 126.1, 319, 320, 404, 405.1, 425/DIG. 48, 121, 126.2, 145, 355, 369, 425/394, 396, 397, 398, 327, 385, 403.1; 156/352, 458, 361, 209, 350
See application file for complete search history.

(56) References Cited

U.S. PATENT DOCUMENTS

| | | | | |
|---|---|---|---|---|
| 3,607,550 A | * | 9/1971 | Ballanger et al. | 156/358 |
| 3,672,592 A | * | 6/1972 | Nichols et al. | 242/332.7 |
| 3,822,168 A | * | 7/1974 | Wech | 156/515 |
| 3,984,272 A | * | 10/1976 | Teed | 156/201 |
| 4,009,981 A | * | 3/1977 | Rosen | 425/388 |
| 4,214,943 A | * | 7/1980 | Stern | 156/504 |
| 4,240,862 A | * | 12/1980 | Ishiyama | 156/350 |
| 4,303,210 A | * | 12/1981 | Fujita et al. | 242/356 |

(Continued)

FOREIGN PATENT DOCUMENTS

JP  2-121827  5/1990

(Continued)

*Primary Examiner* — Joseph Del Sole
*Assistant Examiner* — Seyed M Malekzadeh
(74) *Attorney, Agent, or Firm* — Smith, Gambrell & Russell, LLP (57) ABSTRACT

A carrier tape forming apparatus includes a tape paying-out unit for paying out a tape to be worked, a tape feeding unit for feeding the tape, a forming unit for effecting embossing on the tape, a perforating unit for perforating at least a feeding hole in the tape, and a tape taking-up unit for taking up the finished (embossed) tape thereabout. The apparatus includes also double-acting driving units provided as driving sources at least for the tape feeding unit, the forming unit and the tape taking-up unit, each driving unit being fluid-operated and movable along a straight path and a controller for independently controlling driving/stopping of the double-acting driving units for the forming unit and the tape taking-up unit in association with driving/stopping of said double-acting driving unit for the feeding unit.

6 Claims, 4 Drawing Sheets

U.S. PATENT DOCUMENTS

| | | | |
|---|---|---|---|
| 4,374,463 A * | 2/1983 | Omura et al. | 53/54 |
| 4,556,378 A * | 12/1985 | Nyfeler et al. | 425/143 |
| 4,577,791 A * | 3/1986 | Leinhaas | 226/142 |
| 4,578,140 A * | 3/1986 | Nakajima | 156/384 |
| 4,709,868 A * | 12/1987 | Kashiwaba | 83/37 |
| 4,764,875 A * | 8/1988 | Carrotte et al. | 700/141 |
| 4,881,933 A * | 11/1989 | Wech | 493/225 |
| 5,207,369 A * | 5/1993 | Haji et al. | 228/4.5 |
| 5,288,008 A * | 2/1994 | Haji et al. | 228/180.22 |
| 5,294,282 A * | 3/1994 | Rock et al. | 156/516 |
| 5,389,190 A * | 2/1995 | Larsen et al. | 156/521 |
| 5,470,430 A * | 11/1995 | Lewis et al. | 156/577 |
| 5,573,629 A * | 11/1996 | Rock et al. | 156/522 |
| 5,800,772 A * | 9/1998 | Kurasawa | 264/554 |
| 5,809,873 A * | 9/1998 | Chak et al. | 100/4 |
| 5,832,597 A * | 11/1998 | Yokoyama et al. | 29/837 |
| 5,909,835 A * | 6/1999 | Zanette | 226/112 |
| 5,945,059 A * | 8/1999 | Atake | 264/510 |
| 6,007,888 A * | 12/1999 | Kime | 428/64.1 |
| 6,178,620 B1 * | 1/2001 | Yoshida et al. | 29/740 |
| 6,245,414 B1 * | 6/2001 | Biagiotti | 428/172 |
| 6,547,879 B1 * | 4/2003 | Chiba et al. | 118/210 |
| 2002/0197346 A1 * | 12/2002 | Papadopoulos | 425/194 |

FOREIGN PATENT DOCUMENTS

| | | | |
|---|---|---|---|
| JP | 9-132207 | | 5/1997 |
| JP | 09132207 A | * | 5/1997 |
| JP | 10-273107 | | 10/1998 |
| JP | 2000-62023 | | 2/2000 |

* cited by examiner

DEVICE AND METHOD FOR PROCESSING CARRIER TAPE

TECHNICAL FIELD

The present invention relates to an apparatus and a method for forming a carrier tape having a series of pockets for housing semiconductors, small electronic components or the like formed by embossing a tape blank along its length.

Figure 3:
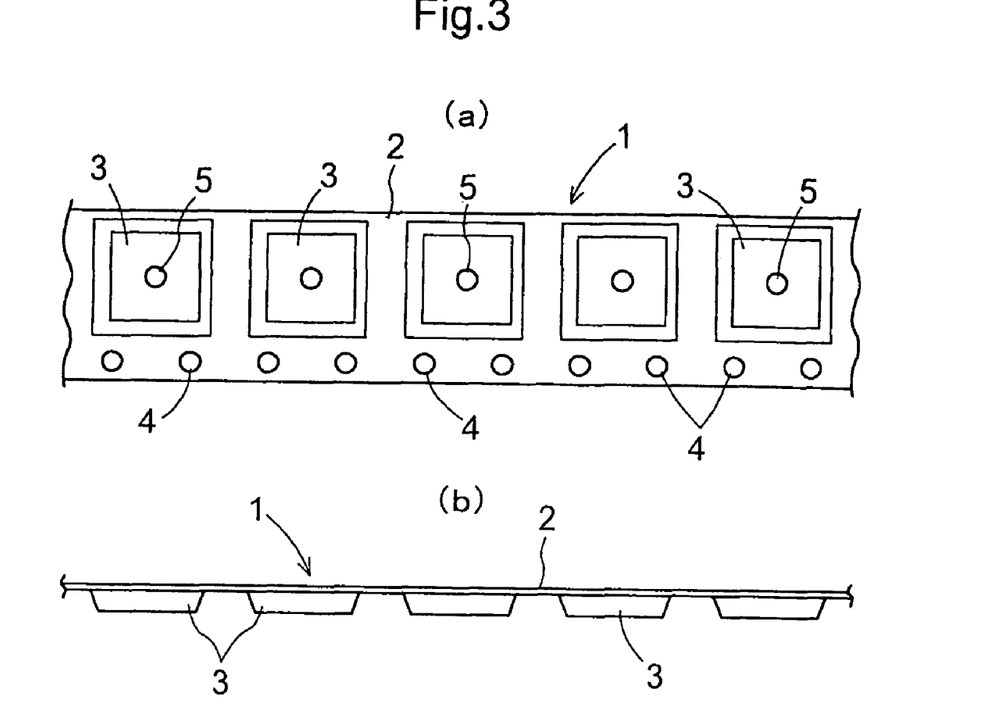
FIG. 3 is a view showing a typical shape of an embossed carrier tape formed by the apparatus.

The embossed carrier tape 1 to be formed, as shown in FIG. 3, includes a plurality of embossed portions 3, referred to as "housing pockets", formed with a predetermined spacing in and along an elongate tape (tape blank) 2. The tape 1 includes also a number of feeding holes 4 and pocket holes 5, etc. which are formed by perforating operations In FIG. 3, (a) is a plan view of the carrier tape 1 and (b) is a front view of the carrier tape 1, respectively.

BACKGROUND ART

A method of forming such embossed carrier tape is known as a technique referred to as intermittent flat pressure forming method (see Japanese Patent Application "Kokai" No. 2002-127242).

Figure 5:
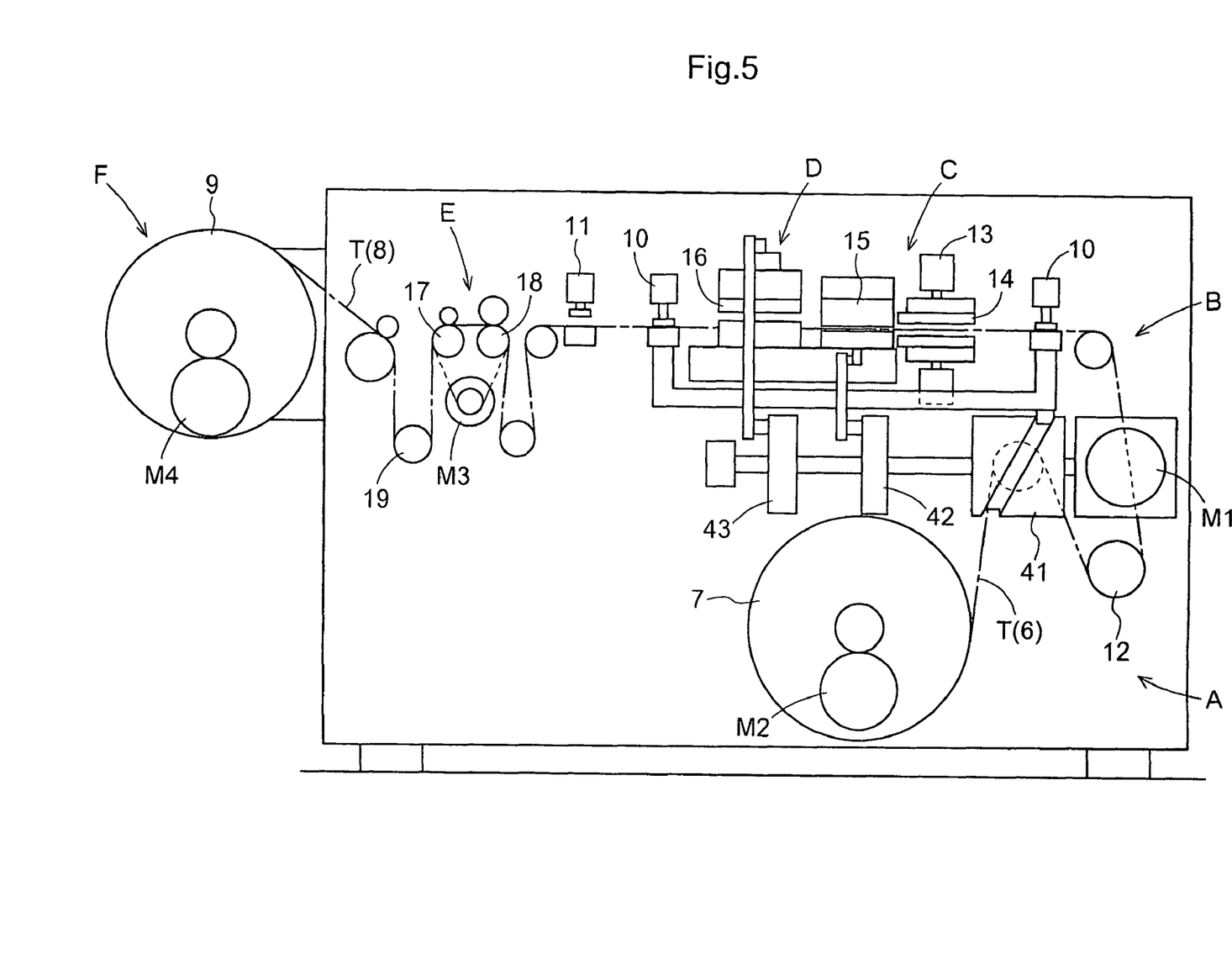
FIG. 5 is a schematic construction view showing a conventional carrier tape forming apparatus.

FIG. 5 schematically shows a general construction of a carrier tape forming machine implementing this intermittent flat pressure forming technique.

This machine includes a tape paying-out unit A including a pay-out reel 7 winding thereabout a tape T (6) to be worked and adapted for paying out the tape T (6), a tape feeding unit B for feeding the tape, a forming unit C for forming the tape, a perforating unit D for perforating the tape, a slitting unit E for effecting determination of the final width of the tape by a slitting operation thereon, and a tape taking-up unit F for taking up the worked tape (finished carrier tape) T (8) about a take-up reel 9.

The machine further includes a feeding cam 41, a clamping/forming cam 42, and a perforating vertical cam 43, so that with rotations of these cams 41, 42, 43, the tape is fed, formed and perforated, respectively.

Referring to the operation of the machine in greater details, the tape T (6, 8) is held by a pair of movable chucks 10, 10 disposed apart along the tape feeding direction. As the feeding cam 41 is rotated by a cam motor M1, the movable chucks 10 are moved to the upper-left side in the figure by a predetermined one stroke amount of the feeding cam 41. Thereafter, the tape T is fixed by a stationary chuck 11.

With the above apparatus, the feeding operation of the tape T (6) depends on a position of a feeding dancer roller 12 associated with the feeding of the tape and this feeding operation is carried out by ON/OFF control of a feeding motor M2 coupled with the pay-out reel 7.

The tape T which has been fed by the one stroke amount of the feeding cam 41 by the movable chucks 10 is then heated by a pair of heating plates 14 which pinch the tape from the opposed sides thereof in association with a movement of a heating cylinder 13. Then, the tape is fed by another stroke amount to be clamped and formed by the clamping/forming cam 42, so that an emboss portion 3 is thermoformed in the tape.

When the tape is fed for still another stroke amount, a perforating mold 16 of the perforating unit D perforates a feeding hole 4 and a pocket hole 5 in association with a movement of the perforating vertical cam 43.

Then, widthwise unnecessary side edge of the formed tape T (8), now a carrier tape, is slit-cut, on the downstream side, by the feeding roll 17 and a slitting blade 18. Lastly, the finished tape is taken up about the take-up reel 9 in association with a movement of a take-up dancer roller 19. In order to realize this operation, there are provided a clutch brake motor M3 for rotatably driving the feeding roll 17 and the slitting blade 18 by predetermining timing and also a take-up motor M4 for the take-up operation by the take-up reel 9.

Therefore, with the conventional tape carrier forming apparatus described above, there are provided separate motors M1, M2,M3 and M4 for the paying-out, feeding, slitting and taking-up operations of the tape, respectively. And, in FIG. 5, these motors are disposed along the width direction of the apparatus which is the depth direction of this figure.

The embossed carrier tape manufactured by such apparatus has standard tape widths of 8, 12, 16, 24, 32, 44 and 56 mm.

On the other hand, regardless of these tape widths, the size of the forming apparatus per se is substantially the same. In recent years, there have been ever increasing demands for miniaturization of components, narrowing of the tape, and small-lot, multi-item production. If these demands to be coped with by increasing the number of such large-sized forming apparatuses within a limited space available for their installment, this will result in disadvantageous reduction in the production line space and the working space available. Consequently, the production efficiency can be deteriorated rather than improved, due to e.g. deterioration of the overall work efficiency.

In view of the above, there is a need to form the apparatus as compact as possible. Namely, a carrier tape forming apparatus which is space saving, yet provides higher production efficiency is strongly desired.

As a method of feeding a carrier tape within the apparatus, as described above, it is possible to hold the tape by the chucks acting as holder means and to feed the tape in association with functioning of a cam. However, with such feeding method using chucks and cam, due to irregularity in the tape forming temperature and/or a clearance required for the cam mechanism for its proper operation, the inter-distance between formed housing pockets, also referred to as "embosses", tends to be instable.

Moreover, as described hereinbefore, in recent years, there has been the need to meet the increasing demand for the small-lot multiple-item production. However, to meet this demand, depending on the final products to be obtained, a great variety of the tape materials and the type of the tapes to be formed are needed. And, the inter-distance between the housing pockets needs to be varied in many ways. In each case, it is necessary to adjust and set the tape feeding amount (stroke) in many ways and with very high precision on the order of micron. With the conventional apparatus, however, as the apparatus uses the motors the cams associated therewith, it is not possible to speedily and appropriately cope with such requirements.

In view of the above-described state of the art, one object of the present invention is to provide a carrier tape forming apparatus which is space-saving, thus providing improved work efficiency and production efficiency. Another object is to provide a method to be implemented with such apparatus. A still further object is to provide a carrier tape forming apparatus which can cope readily and speedily with any various required changes in the tape material, item type and tape feeding stroke.

DISCLOSURE OF THE INVENTION

For accomplishing the above-noted objects, the invention proposes a carrier tape forming apparatus having the following characterizing features.

1. A carrier tape forming apparatus comprising a tape paying-out unit for paying out a tape (tape blank) to be worked, a tape feeding unit for feeding the tape, a forming unit for effecting embossing on the tape, a perforating unit for perforating at least a feeding hole in the tape, and a tape taking-up unit for taking up the finished (embossed) tape thereabout;

wherein the apparatus comprises, double-acting driving units provided as driving sources at least for the tape feeding unit, the forming unit and the tape taking-up unit, said each driving unit being fluid-operated and movable along a straight path; and a controller for independently controlling driving/stopping of said double-acting driving units for said forming unit and said tape taking-up unit in association with driving/stopping of said double-acting driving unit for said feeding unit.

With the above-described tape carrier forming apparatus, this apparatus employs the double-acting driving units which are fluid-operable. Therefore, as these driving units, cylinders or the like may be employed. For instance, regarding the tape feeding unit which is the major component of the apparatus, the cylinder provided for this unit can be mounted with its straight driving path being aligned with the feeding direction of the tape. With this construction, the entire apparatus per se can be formed compact. Moreover, such driving units described above occupy much smaller space within the apparatus than the motors or the like employed in the conventional apparatus. The increased inner space made available can be used for storing and setting a greater length of the tape or greater number of tapes within the apparatus at one time.

Further, as the above construction of the invention does not require any cams, the trouble of e.g. interchanging of cam required to cope with e.g. a change in the specifications can be eliminated completely. Further, such change in the specification when needed can be readily and speedily coped with by means of timing adjustment of the driving/stopping of the respective double-acting driving units to be made at the controller.

Also, since the driving system of the apparatus does not use any cams, the mechanical looseness inevitable with the cam mechanism can be eliminated by the control of the operation of each double-acting driving unit employed instead.

In the above-described construction, the following construction is preferred.

2. The paying-out operation by the tape paying-out unit is effected by the double-acting driving unit provided for the tape feeding unit for feeding the tape feeding operation.

With the above, the tape feeding unit and the tape paying-out unit can be driven by the single driving unit. Hence, the total number of the driving units required by the apparatus can be reduced. Moreover, the feeding operation and the paying-out operation can be synchronized with each other in a more reliable manner.

In this construction, the following construction is preferred.

3. The tape paying-out unit includes a pay-out reel winding the tape to be worked thereabout, a dancer roller for adjusting the paying-out operation and a brake belt for braking a reel shaft of the pay-out reel; and a braking amount of the brake belt is adjusted for adjusting an amount of the tape to be paid out from the tape paying-out unit, in accordance with a movement of the dancer roller associated with the feeding operation of the tape feeding unit.

With use of the above construction, it becomes possible to pay out the tape from the tape paying-out unit with applying an appropriate tension thereon. Further, it becomes also possible to prevent paying-out of an excessive amount (length) of the tape once the paying-out operation is completed.

The following construction is also preferred.

4. The apparatus further comprises a slitting unit for slitting or cutting off a width-wise end of the tape; and a rotary cutter and a feeding roller provided in said slitting unit are rotatably driven by said double-acting driving unit provided for the tape feeding unit for feeding the tape.

With the above construction, the setting or adjustment of the final tape width required for forming a carrier tape can be effected by the double-acting driving unit provided for the tape feeding unit.

The above has described the driving system of the apparatus. Regarding the tape feeding by the tape feeding unit, the following construction is preferred.

5. The tape feeding unit includes a tape holding means movable back and forth in unison by the double-acting driving unit for the tape feeding unit and a stopper for restricting a position of the tape holding means thereby to adjust the feeding amount of the tape.

With the stopper means described above, precision control of the tape feeding condition is made possible by positioning by the stopper in case the adjustment of e.g. a driving stop position of the double-acting driving unit is insufficient for that purpose.

As will be described later, if this stopper is adapted to be interchangeable according to e.g. a required particular work specification, the change of specification required can be coped with interchange of this stopper. In this case, although some adjustment may be needed on the side of the controller, the above-described construction of the invention allows this operation to be effected easily and speedily, so that with repetition of test runs, an optimum operating condition can be found easily.

According to experiments conducted by the present inventors, adjustment up to the micron order was possible by the positioning function of the stopper.

As the construction of the above stopper, the following construction is preferred.

6. The stopper includes a forwardmost position determining portion, a rearmost position determining portion and a feeding amount adjusting portion, the feeding amount of the tape being adjustable by the feeding amount adjusting portion.

With this construction, adjustment is readily possible by the feeding amount adjusting portion.

Regarding holding of the tape in association with feeding of the tape, the following construction is preferred.

7. The tape holding means includes at least one pair of tape holders provided across the forming unit and the perforating unit, and a connecting member for connecting the pair of tape holders together to be movable back and forth by the double-acting driving unit.

As one pair of tape holders are provided across the forming unit and the perforating unit, it is possible to hold and feed the tape by holding this tape over a necessary and sufficient span or length (corresponding to the distance between the units) thereof. As a result, the feeding operation may be effected in a stable manner and it becomes also possible to avoid application of e.g. excessive tension to the tape.

The above description has concerned the carrier tape forming apparatus relating to one aspect of the present invention. According to a further aspect of the present invention, there is provided a carrier tape forming method to be described next.

8. A method of forming a carrier tape comprising the steps of: paying out a tape to be worked from a tape paying-out unit; fixing the tape in position at a forming unit and then embossing the tape at the forming unit; and releasing the worked tape; and taking up the worked tape at a tape taking-up unit;

wherein the tape is held by tape holding means provided across said forming unit; said tape holding means as holding the tape is moved together linearly by a double-acting driving unit which is fluid-operable, so as to pay out the tape from the tape paying-out unit and feed the tape intermittently; and the tape is formed and worked at the forming unit under a suspended condition not effecting the feeding operation.

In implementing the above-described method, it is preferred that the feeding position be controlled by means of the stopper as described hereinbefore in connection with the invention's apparatus. In this case, the following construction will be employed.

9. In the step of fixing the tape in position, this position fixing operation is effected with a feeding amount of the tape moved by the double-acting driving unit being restricted by a stopper.

As described hereinbefore, in the case of the cam mechanism, adjustment of a small feeding amount (stroke) is very difficult since the amount of movement is governed solely by the shape of the cam employed. On the other hand, with the above-described construction, desired adjustment is readily made possible by varying the position of the stopper at the end of its movable range. Further, with this construction, it is also possible to reduce the space to be occupied by the driving system within the apparatus. As a result, small change in the feeding amount which differs from one type of tape to another can be readily coped with. And, the apparatus can accommodate and use a larger reel for setting a greater length of tape therein at one time.

Moreover, change of the tape blank to form a carrier tape made of material having a different contraction ratio can be effected speedily, since associated change in the feeding amount for that new tape can be easily made by e.g. adjustment of a shim provided in the stopper.

With the above-described carrier tape forming method of the present invention, it is possible to improve the precision in the inter-distance between the housing pockets for an extended period of time and to easily manufacture a variety of carrier tapes made of different materials and having different dimensions.

Further and other objects and features of the invention will become apparent upon reading the following detailed description of preferred embodiments thereof with reference to the accompanying drawings.

BEST MODE OF EMBODYING THE INVENTION

Figure 1:
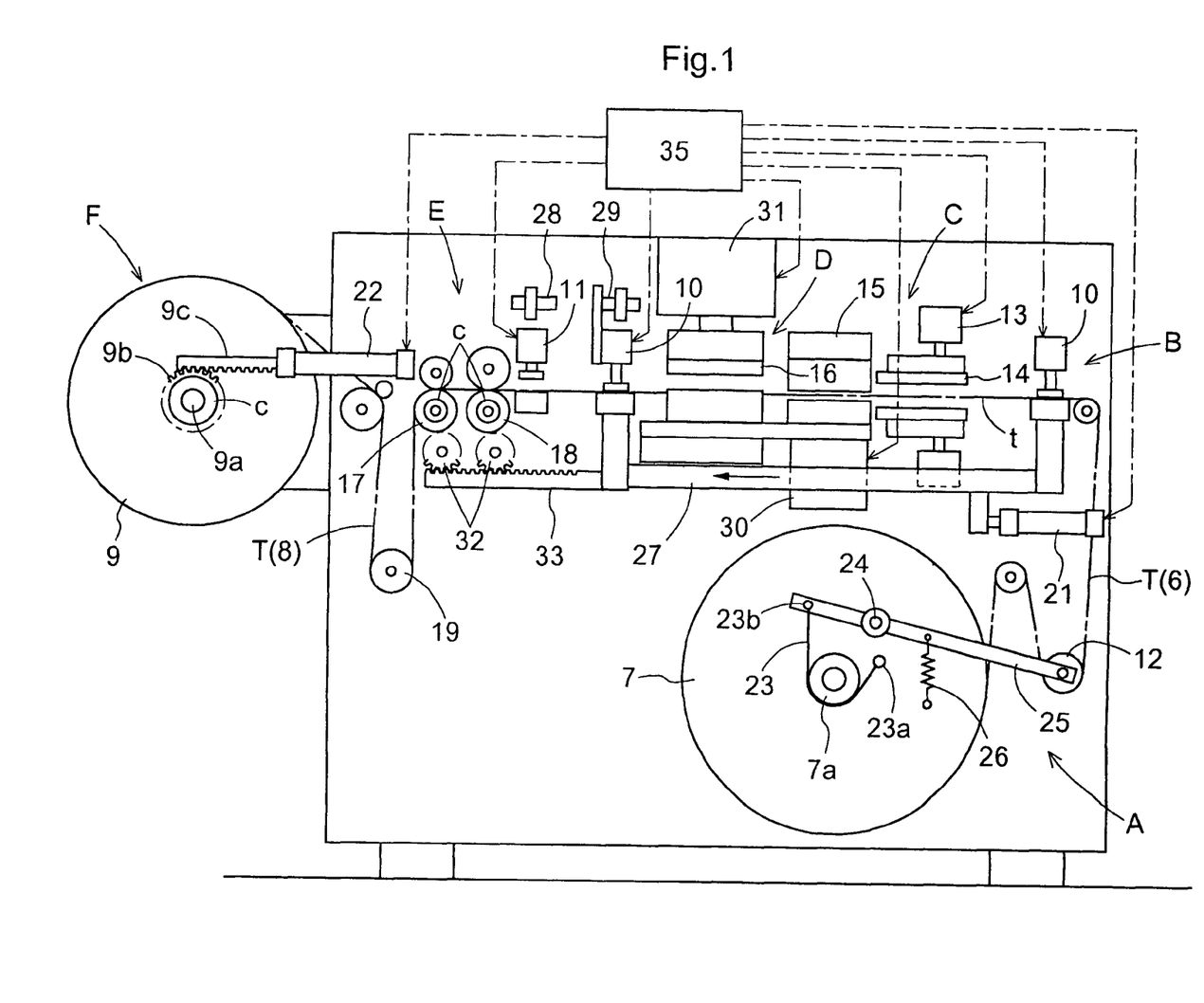
FIG. 1 is a schematic construction view of a carrier tape forming apparatus relating to the present invention.

FIG. 1 shows a carrier tape forming apparatus according to one preferred embodiment of the present invention. In this figure, components having identical functions as those of the conventional forming apparatus are denoted with identical reference marks.

In this tape forming apparatus, as components of its driving system, there are provided an air cylinder 21 for feeding a tape and a further air cylinder 22 for taking up the tape. Further, a paying-out operation of the tape T (6) and a slitting operation for fixedly setting the final width of the tape T take off or obtain power therefor from drive of a tape feeding unit B.

In this particular embodiment, the driving system of the apparatus employs the air cylinders 21, 22 as described above. However, the invention is not limited thereto. The invention can employ any other type of double-acting driving units as long as such unit too is movable along a straight path and is fluid operated.

Like the conventional apparatus described hereinbefore, the apparatus of the invention also includes the tape paying-out unit A, the tape feeding unit B, the forming unit C, the perforating unit D, the slitting unit E and the tape taking-up unit E.

Next, these respective units of the apparatus will be described with reference to the drawings.

[Tape Paying-Out Unit A]

This unit A is operable for sequentially paying out the tape T (6) (tape blank) wound about a pay-out reel 7. The unit A includes the pay-out reel 7 and a dancer roller 12 for adjusting the tape T (6) to be paid out from the pay-out reel 7.

As described hereinbefore, this paying-out operation from the reel 7 is effected in accordance with the feeding operation at the tape feeding unit B. Also, in order to adjust this paying-out operation of the tape from the reel 7, a braking force to be applied to a reel shaft 7a of the pay-out reel 7 is adjusted in association with a variable vertical position of the pay-out dancer roller 12.

More particularly, as shown in FIG. 1, a brake belt 23 having one end 23a thereof fixed to a body (not shown) of the apparatus is adapted to come into contact with an outer peripheral portion of the reel shaft 7a. The other end 23b of the belt 23 is connected to a dancer arm 25 which is pivotable about a pivot 24 provided on the side of the apparatus body. This dancer arm 25 rotatably carries the pay-out dancer roller 12. Then, in association with a vertical position of the pay-out dancer roller 12, the position of the other end of the brake belt 23 is fixedly set.

Further, the dancer arm 25 includes a pull spring 26 provided between the apparatus body and this arm and acting as urging means. With the function of this urging means, the pay-out dancer roller 12 is urged downward while the other end 23b of the brake belt 23 is urged upward, that is, in the direction for applying the braking force to the reel shaft 7a.

Therefore, under a normal condition when the tape T (6) is not subjected to the paying-out force from the tape feeding unit B, as shown, the pay-out dancer roller 12, the dancer arm 25 and the spring 26 cooperate to apply a braking force to the reel shaft 7a for preventing excessive pay-out of the tape.

On the other hand, when the dancer roller 12 is moved upward in association with the feeding of the tape T (6) by the operation at the tape feeding unit B (this means pulling and paying-out of the tape from the view point of the tape paying-out unit A), the braking force from the brake belt 23 is released, whereby the reel shaft 7a is allowed to rotate for paying out the subsequent length of the tape T (6). With this construction, it is possible to eliminate a driving source such as a small motor which used to be required independently for the tape paying-out unit A, so that the entire apparatus can be formed compact. In this construction, the tension to be applied to the tape T (6) will vary, depending on such factors as the material forming this tape. However, it is preferred that the tension be adjusted between 400 g and 500 g.

[Tape Feeding Unit B]

This unit B is operable for intermittently feeding a tape portion (t) paid out from the tape paying-out unit A and extending straight across the forming unit C and the perforating unit D toward the tape taking-up unit F. The tape feeding path is a straight path and a direction of the feeding air cylinder 21 is aligned with this direction.

To the above-described end, the feeding unit B includes, as tape holding means, a pair of movable chucks 10, 10 (example of "holders") along the extending direction of the tape. And, these movable chucks 10, 10 are assembled and interconnected together by a connecting plate 27 as a connecting member. So that, the movable chucks 10, 10 and the connecting plate 27 are together movable along the extending or longitudinal direction of the tape, which is the right and left direction in the figure. This unified movement is effected by the reciprocal movement of the tape feeding air cylinder 21 described hereinbefore.

In the instant construction, as described above, the pair of movable chucks 10, 10 are provided across the forming unit C and the perforating unit D and these chucks are moved together intermittently. With this construction, it becomes possible to significantly reduce the possible range of variation in the feeding amount of the tape. At the same time, it becomes possible to render the tension to be applied to the tape constant and prevent influence of an external force. As a result, there will occur no longitudinal extension or contraction in the tape and high dimensional precision can be achieved stably and over an extended time.

The movable chucks 10, 10 can be adapted for pinching the tape from the above and the under thereof. However, driving of the chucks can be done from both the above and the under or can be done only from either the above or the under. For better holding of the tape and not giving any damage to the tape, it is preferred that the portions of the chucks to come into contact with the tape have high friction coefficient and low hardness.

As the construction of the invention employs the pinching or clamping type chucks, it is not necessary to adopt such a reciprocal construction as a pin-feeding type construction for feeding the tape by inserting a pin into a feeding hole of the tape, which construction provides a rectangular moving path with which the vertical position of the movable chucks or the like differ between the forward movement path portion and the backward movement path portion. In the case of such pin-feeding construction, the position in the backward path portion is generally set as a lower position since the pin is drawn out of the feeding hole.

For effecting the intermittent feeding, the connecting plate 27 is connected to the above-described feeding air cylinder 21 and disposed to extend through the forming unit C and the perforating unit D. With this, it is possible to ensure a sufficient distance between the movable chucks 10 disposed respectively on the forward (downstream) and rear (upstream) sides of the forming unit. Further, in order to enhance its rigidity, the connecting plate 27 preferably includes a plurality of linear guides. With this, it becomes possible to obtain an even more stable reciprocal movement.

The fluid to be used in the feeding cylinder is not particularly limited in the present invention. However, if a high-speed operation is required or desired, air should be used as the operating fluid.

Referring to adjustment of the stroke amount, as shown in FIG. 1, at the forward end of the movable chucks, there is provided a stroke stopper 28 for determining the feeding stroke and at the rear end of the chucks, there is provided a stationary stopper 29. Preferably, the stroke stopper 28 allows fine adjustment of the feeding amount in the unit of micron. Further, it is also preferred that the stroke stopper 28 and the stationary stopper 29 each be equipped with a shock absorber for absorbing shock.

FIG. 1 referred to in the foregoing description shows a condition when the feeding air cylinder 21 is at its origin, which is its retracted position and the connecting plate 27 is at its rearmost position. Further, in this figure, the forward side (downstream) movable chuck 10 is placed in contact with the stationary stopper 29 and the two movable chucks 10 hold the tape T (6, 8) therebetween. From this condition, the cylinder effects its forward stroke movement.

Figure 2:
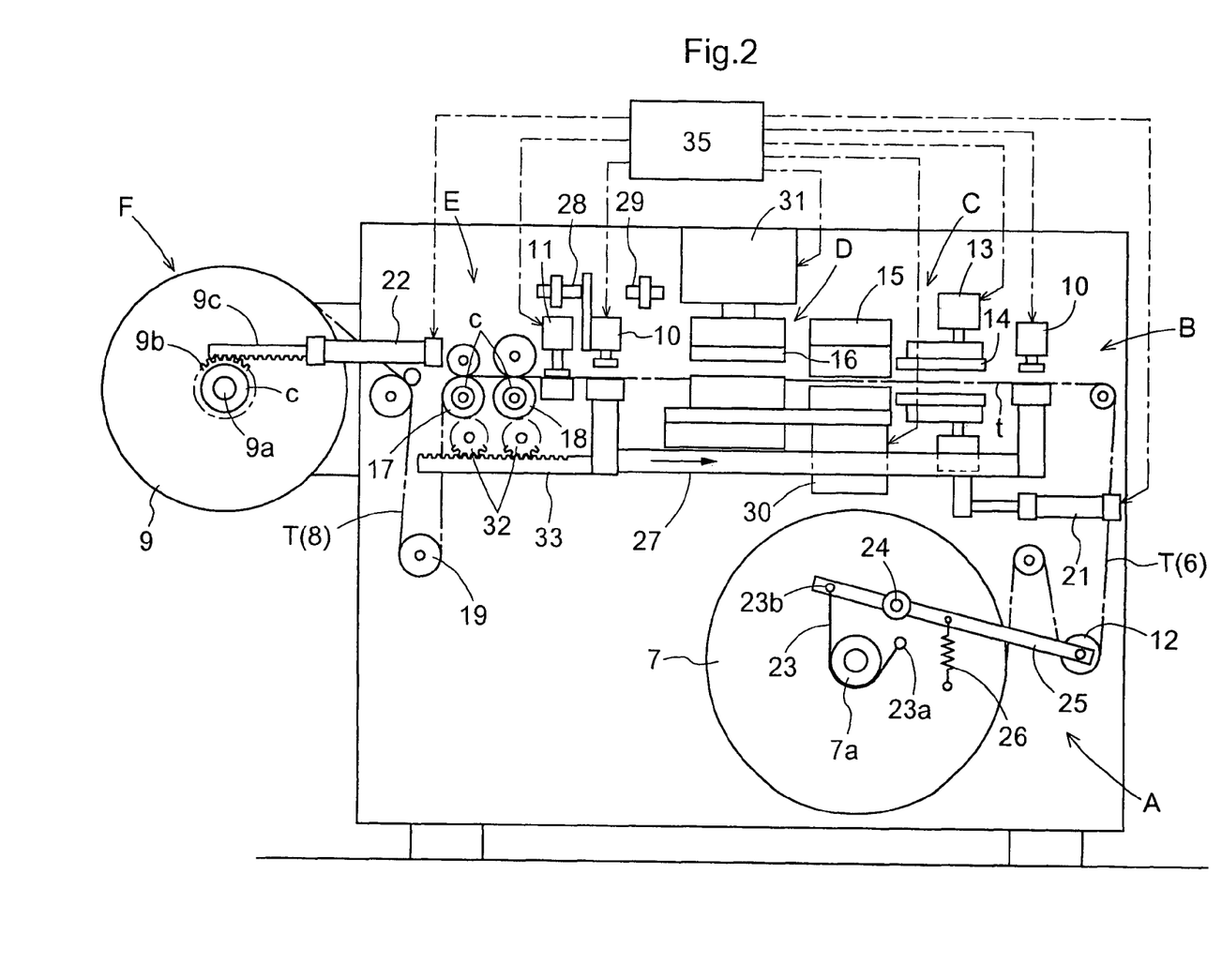
FIG. 2 is a view showing a condition of the carrier tape forming apparatus shown in FIG. 1 when the apparatus has finished a tape feeding operation.

On the other hand, FIG. 2 shows a condition one-stroke advanced from the condition of FIG. 1. In this condition of FIG. 2, the forward movable chuck 10 is in contact with the stroke stopper 28. In this illustrated condition, the holding of the tape by the movable chucks 10 has been released and the stationary chuck 11 is in operation instead. From this condition, the cylinder effects its reverse stroke movement.

[Forming Unit C]

The forming unit C is basically same as the conventional forming unit. This unit C, however, employs the cylinder as its drive source for effecting the heating and clamping operations. That is, the unit includes a heating cylinder 13 and a heating plate 14 corresponding thereto and a clamping air cylinder 30 mounted in a lower base of a forming mold 15 for forming, so that this cylinder 30 effects a clamping/forming operation on the tape.

Preferably, the clamping/forming cylinder 30 allows stroke adjustment for adjusting its clamping/forming force.

[Perforating Unit D]

This perforating unit D too employs the cylinder as its driving source. As shown, the unit D includes a perforating air cylinder 31 disposed at an upper portion of the unit D. In operation, the cylinder presses a perforating mold 16 for forming the feeding hole 4 and the pocket hole 5 in the tape.

As described above, by providing all of the driving sources for the tape paying-out unit A, forming unit B and perforating unit C as the cylinders, it is possible to eliminate the large motors and the cam mechanisms which were required in the conventional apparatus.

Consequently, the entire forming apparatus can be formed compact. Also, soiling of the tape by powder dust such as carbon dust generated from the motors or oil mist generated from lubricant used for the cams can be avoided.

[Slitting Unit E]

The slitting unit E employed by the present invention too includes a slitting blade 18 and a feeding roll 17 like the convention. However, the rotational drive for this unit is provided from the feeding air cylinder 21 which is used in the tape feeding unit B.

Specifically, the connecting plate 27 is coupled with a rack gear 33 and a pinion gear 32, so that by using rotation of the pinion gear 32, the slitting blade 18 and the feeding roll 17 are rotatably driven for slitting or cutting off the widthwise end of the tape. Advantageously, a one-way rotation clutch c may be provided in either the slitting blade 18 or the feeding roll 17, so as to prevent back lash.

[Tape Taking-Up Unit F]

This tape taking-up unit F too employs a cylinder as its driving source. Specifically, a take-up main shaft 9a of the take-up reel 9 mounts a pinion gear 9b and a rack gear 9c, so that the tape T (8) may be taken up by an action of the take-up air cylinder 22. The take-up reel 9 includes a one-way rotation clutch c. The operation of the air cylinder 22 can be effected by a take-up dancer roller 19. The take-up operation of the tape is started when the roller 19 is located at the lower-end position and the operation is stopped when the roller 19 is located at the upper-end position.

[Controller 35]

With the carrier tape forming apparatus of the invention, the paying-out, feeding and taking-up operations of the tape T (6, 8) are effected by the feeding air cylinder 21 and the take-up air cylinder 22 and also upon completion of the intermittent feeding, the heating cylinder 13, the clamping air cylinder 30 and the perforating cylinder 31 are activated. For realizing these operations, the controller 35 is provided for setting operational timings of the respective cylinders relative to each other. And, when the intermittent feeding operation is stopped or suspended, the heating operation, the clamping operation and the perforating operation are carried out at the predetermined respective positions of the apparatus.

At a predetermined timing, the tape T is switched from its condition of being held by the movable chucks 10, 10 to the further condition of being held by the stationary chuck 11, and the movable chucks 10, 10 now under the free condition thereof are returned to the retracted position thereof by a retracting movement of the air cylinder 21.

As described above, according to this embodiment, the construction can eliminate motors as all the driving sources. As a result, the apparatus can be formed compact. And, also, the clean environment can realized in the manufacturing site.

Example 1

An elongate polystyrene tape for making a carrier tape was charged into the above-described carrier tape forming apparatus of the invention for effecting an embossing operation thereon. The elongate tape to be worked had a tape width of 14 mm and thickness of 0.3 mm. And, pockets having dimensions of: 6 (vertical)×6.5 (lateral)×1.5 (deep) were formed with a pitch of 8 mm therebetween. 8 of such pockets were formed in a one shot (one stroke) feeding length of 64 mm. Further, feeding holes having a diameter of 1.55 mm were formed at the perforating unit with 16 of them being formed in the one shot length. Further, pocket holes having a diameter of 1.5 mm were formed, with 8 of them being formed in the one shot lengthy.

The tape was slit-cut to obtain a final tape width of 12 mm The forming operation was conducted at 200° C. and the process was conducted at a working rate of 60 shots/min.

The dimensions of the resultant embossed carrier tape taken up about the take-up reel were determined. It was found all of the dimensions were within the standards. And, there was no problem in its appearance either. Hence, the embossed carrier tape obtained in the experiment was found as good as the embossed carrier tape formed by the conventional carrier tap emboss forming apparatus.

Further, the absence of motors has made the forming apparatus compact and space-saving, leaving additional free space in the manufacturing line space in the width direction of the apparatus (the depth direction in FIGS. 1 and 2). The additional space allowed setting of three rolls of elongate tapes each having a length of 2000 m on the reel shaft 7a, in contrast to the conventional construction which barely allowed one roll of 1000 m length elongate tape. As a result, the production efficiency was improved. Further, since the apparatus of the invention does not use any cams, the apparatus could employ a larger-diameter reel as the reel 7. In fact, the reel 7 shown in FIG. 1 is larger in diameter than the reel shown in FIG. 5.

Next, other embodiments of the invention will be described.

(1) In the foregoing embodiment, for the purpose of setting the feeding amount, the stroke stopper 28 and the stationary stopper 29 are provided as two separate components. Instead, these stoppers may be integrated into one component. And, this integrated component can be adapted to be interchangeable to cope with possible variation of the tape material, the shape of the housing pockets etc.

The various kinds of resin for forming the carrier tape have different contraction coefficients. Hence, the feeding amounts thereof need to be different also, depending on the kind of the resin material for a same shape of tape or on the particular shape of the tape to be formed. Further, in order to cope with the multiple-item production, easy adjustment of the inter-pocket distance should be made possible.

Hence, in order to cope with these needs speedily, a further embodiment of the invention employs such an interchangeable stopper 36, which is interchangeably mounted to the apparatus body or the stationary component thereof.

Figure 4:
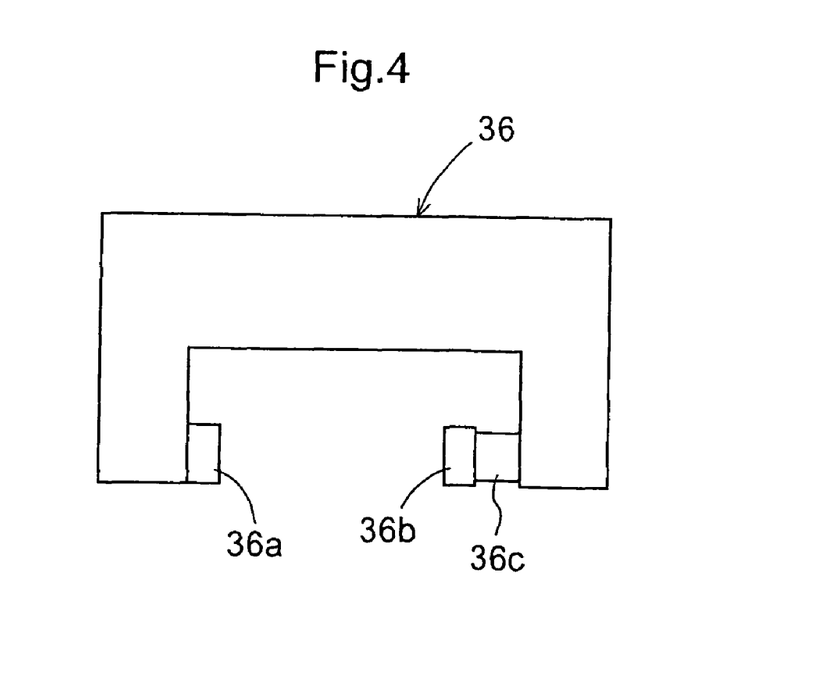
FIG. 4 is a view showing an alternative construction of a stopper used in the apparatus.

More particularly, as shown in FIG. 4, this stopper 36 includes a forwardmost position determining portion 36a for determining a forwardmost position of the movable chucks movable by the feeding air cylinder 21 located downstream of the forming unit, a rearmost position determining portion 36b for determining a rearmost position of the tape holding means located upstream of the forming unit, and a feeding amount adjusting portion 36c for adjusting the feeding amount. Then, by e.g. varying the size of this feeding amount adjusting portion 36c, a desired feeding amount can be obtained easily.

Further, preferably, at the stroke end, a shock absorbing damper or shock absorbing material should be used. Or, a cylinder having acceleration and deceleration functions may be used.

(2) In the foregoing embodiment, the driving force for paying out the tape T (6) from the pay-out reel 7 is obtained or taken off from the force of the feeding operation by the tape feeding unit B. Instead, a small motor may be used for this purpose, just like the conventional construction.

(3) In the foregoing embodiment, the driving force for driving the feed roll 17 and the slitting blade 18 at the slitting unit is obtained from the tape feeding unit B. Instead, a small motor may be used for this purpose, just like the conventional construction.

INDUSTRIAL APPLICABILITY

The carrier tape emboss forming apparatus of the invention is compact and space-saving, so that the production line density can be increased and the carrier tape emboss forming process may be carried out with higher production efficiency.

The invention claimed is:

1. A carrier tape forming apparatus comprising:
 a tape paying-out unit for paying out a tape to be worked;
 a tape feeding unit for feeding the tape;
 a forming unit for effecting embossing on the tape;
 a perforating unit for perforating at least a feeding hole in the tape;
 a tape taking-up unit for taking up the finished tape thereabout;
 a first double-acting driving unit with a straight driving path in the same direction as a feeding direction of the tape along a straight driving path and being fluid-operated for driving the tape feeding unit;
 a second double-acting driving unit with a straight driving path in the same direction as the feeding direction of the tape along the straight driving path and being fluid-operated for driving the tape taking-up unit; and
 a controller for controlling driving/stopping of the second double-acting driving unit in association with driving/stopping of the first double-acting driving unit;

wherein the tape paying-out unit includes a pay-out reel winding the tape to be worked thereabout, a dancer roller for adjusting the paying-out operation and a brake belt for braking a reel shaft of the pay-out reel; and wherein in accordance with a movement of the dancer roller associated with the feeding operation of the tape feeding unit, a braking operation of the brake belt is released and the pay-out reel is driven in association with the paying-out operation of the tape of the tape paying-out unit.

2. The apparatus according to claim 1, further comprises a slitting unit for slitting or cutting off a width-wise end of the tape; and a slitting blade and a feeding roller provided in said slitting unit are rotatably driven by said first double-acting driving unit provided for the tape feeding unit for feeding the tape.

3. The apparatus according to claim 1, wherein the tape feeding unit includes a tape holding means aligned with the feeding direction of the tape and is movable back and forth in unison by the first double-acting driving unit for the tape feeding unit and a stopper for restricting a position of the tape holding means thereby to adjust a feeding amount of the tape.

4. The apparatus according to claim 3, wherein the stopper includes a forwardmost position determining portion, a rearmost position determining portion and a feeding amount adjusting portion, the feeding amount of the tape being adjustable by a feeding amount adjusting portion.

5. The apparatus according to claim 4, wherein the tape holding means includes at least one pair of tape holders provided across the forming unit and the perforating unit, and a connecting member for connecting the pair of tape holders together to be movable back and forth by the first double-acting driving unit.

6. The apparatus according to claim 1, wherein the tape taking-up unit includes a take-up reel, a pinion gear, and a rack gear, and wherein the pinion gear and rack gear cooperate to convert straight-line driving to rotational driving of the second double-acting driving unit thereby rotating the tape taking-up reel.

* * * * *